United States Patent [19]

Lux

[11] Patent Number: 5,296,207
[45] Date of Patent: Mar. 22, 1994

[54] COMPOSITE ELEMENT, PROCESS FOR ITS PREPARATION AND ITS USE

[76] Inventor: Benno Lux, Brentsch-Park 85, CH-7550 Scuol/GR, Switzerland

[21] Appl. No.: 749,304

[22] Filed: Aug. 23, 1991

[30] Foreign Application Priority Data

Aug. 31, 1990 [DE] Fed. Rep. of Germany ....... 4027580

[51] Int. Cl.$^5$ ............................................. B01J 3/06
[52] U.S. Cl. .................................... 423/446; 156/610; 156/615; 156/DIG. 68
[58] Field of Search ....... 156/600, 610, 613, DIG. 68, 156/DIG. 89; 423/446

[56] References Cited

FOREIGN PATENT DOCUMENTS

| | | |
|---|---|---|
| 136408 | 6/1984 | European Pat. Off. . |
| 257439 | 3/1988 | European Pat. Off. . |
| 0282075 | 9/1988 | European Pat. Off. . |
| 386727 | 9/1990 | European Pat. Off. . |
| 2805460 | 8/1978 | Fed. Rep. of Germany . |
| 3030149 | 2/1981 | Fed. Rep. of Germany . |
| 60-12747 | 5/1985 | Japan . |
| 60-12750 | 11/1985 | Japan . |

OTHER PUBLICATIONS

Isotropic Enhancement of Thermal Conductivity and Damage Threshold in Diamond, Seitz (Feb. 1989)—Harvard Univ.
Type IIa Diamond—The Superlative Heat Sink, by F. A. Raal, in Industrial Diamond Review, (May 1972), S.192–197.
Diamond Heatsinks, by R. Berman, in Electronic Engineering, Bd.42, (Aug. 1970), S.43–45.

*Primary Examiner*—Olik Chaudhuri
*Assistant Examiner*—Felisa Garrett
*Attorney, Agent, or Firm*—Paul & Paul

[57] ABSTRACT

A composite element is disclosed, having improved heat conductivity, and is composed of a substrate whose surface layer enables homeo- or heteroepitactic growth of the diamond lattice from the gas phase, and of a low pressure diamond layer grown on the substrate, and in which the diamond layer grown is enriched compared to the normal diamond composition in the carbon isotope $C^{12}$ and depleted in the heavier carbon isotopes $C^{13}$ and $C^{14}$.

18 Claims, No Drawings

COMPOSITE ELEMENT, PROCESS FOR ITS PREPARATION AND ITS USE

The high heat conductivity of diamond is used industrially for the conduction of heat, relatively pure, monocrystalline natural diamonds or high pressure diamonds being used. Since the transport of heat in diamond, in contrast to most metallic conductors, is carried less by the free electrons than by phonons, i.e. quantised lattice oscillations (see W. Schatt, Einführung in die Werkstoffwissenschaft (Introduction to Material Science), page 422, VEB Deutscher Verlag für Grundstoff-industrie, Leipzig 1981), it was long predicted on the basis of theoretical considerations that the heat conductivity in an isotopically pure diamond crystal lattice had to be substantially higher than in normal diamonds, which are composed of several carbon isotopes ($C^{12}$, $C^{13}$, $C^{14}$). This theoretical consideration was confirmed by the preparation of a relatively pure $C^{12}$ diamond single crystal with the aid of the high pressure diamond synthesis (see Science, Research News, Jul. 6, 1990, pages 27/28 and NZZ-Forschung und Technik, No. 180, page 35, Aug. 8th 1990 and T Anthony, NATO Summer School, Castel Vecchio, Italy, July 1990).

In high pressure single crystalline diamonds enriched in the carbon isotope $C^{12}$, heat conductivities have been measured at room temperature which are about ten times the value for pure copper. It was possible to show that a reduction in the carbon isotopes $C^{13}$ and $C^{14}$ compared to the normal isotope distribution in diamonds of about 1% to 0.5% already led to a distinct increase in the heat conductivity. However, this effect only occurs in a relatively defect-free single crystal lattice, since defects in the crystal lattice affect an undisturbed phonon oscillation just as negatively as unequal atomic weights.

The low pressure diamond synthesis enables, by use of gases enriched in the carbon isotope $C^{12}$ as starting material, the preparation of such enriched diamond layers. However, this synthesis normally leads to polycrystalline diamond layers, which have many crystal lattice defects (see Ch. Chatfield et al., J. Mat. Science Letters, 1989), by means of which the heat conductivity can be so greatly reduced that even in a strongly $C^{12}$-enriched diamond which has been prepared in this manner, the increase in the heat conductivity compared with a diamond lattice constructed from the natural isotope mixture is not substantially improved.

To date, attempts to use the low pressure synthesis for the preparation of diamonds in which the isotope effect can be utilised have not succeeded. Rather, a two-step process has been used until now (see Science, Research News, Jul. 6, 1990, pages 27/28 and NZZ-Forschung und Technik, No. 180, page 35, August 1990). In this process, a crude diamond enriched in the isotope $C^{12}$ is first prepared using the low pressure synthesis and is then completely dissolved again in a second process step in the high pressure process and only then grows under high pressure to give a single crystal. This procedure is complicated and expensive.

The object underlying the invention was therefore to obtain a diamond having improved heat conductivity, which can be prepared more simply avoiding the two-step process described.

According to the invention, this object has been achieved with a composite element having improved heat conductivity, which is composed of a substrate whose surface layer enables homeo- or heteroepitactic growth of the diamond lattice from the gas phase, and of a low pressure diamond layer grown on the substrate and is characterised in that the low pressure diamond layer grown is enriched compared to the normal diamond composition in the carbon isotope $C^{12}$ and depleted in the heavier carbon isotopes $C^{12}$ and $C^{14}$.

A composite element of this thpe can be prepared in a single-step low pressure syntheis process, which is a considerable enrichment of the art compared with the expensive two-step process described above.

In order to ensure that the low pressure diamond layer grown on the substrate is not only enriched in the carbon isotope $C^{12}$, but also as free as possible from crystal lattice defects, which further increases the effect of improved heat conductivity, it is preferable that the substrate of the composite element is either composed entirely of a single crystal or has a single crystalline surface layer.

The entirely single crystalline substrate or the single crystalline surface layer of the substrate on which the low pressure diamond layer is grown can be composed, for example, of non-$C^{12}$-enriched single crystalline diamond, such as a natural diamond substance, a high pressure diamond substance or a low pressure diamond substance or of a surface layer therefrom, there being the possibility of the choice of suitable and preferred crystal orientations, such as, for example, (100)/(110)/(111).

Instead, the single crystalline substrate or the single crystalline surface layer of the substrate can also be composed of another material on whose surface a single crystalline diamond coating is formed heteroepitactically under the conditions of a low pressure diamond synthesis. A material of this type can be, for example, BN in one of its metastable, superhard forms, BP, $C_3N_4$ or a mixed crystal, a ternary phase or a mixed substance composed of one or more of the elements C, B, N, O, P and/or S. Preferred crystal surfaces can also be chosen using these materials.

Finally, the single crystalline surface layer of the substrate can also be composed of a thin layer up to a monomolecular layer of diamond-like carbon, amorphous diamond or another C-containing substance, such as of a:C or a:CH or carbon-containing materials having the spatial structure of the adamantites.

It is essential that the substrate or its surface layer is suitable for growing the $C^{12}$-enriched diamond epitaxially, preferably in single crystalline form, with the aid of the low pressure synthesis using correspondingly $C^{12}$-enriched gases. This is in any case possible with substrates or substrate surface layers which are single crystalline substances or thin single crystalline layers whose surface atoms enable formation of a nucleus and homeo- or heteroepitactic growth of the diamond lattice from the gas phase due to their particular geometrical arrangement and chemical bonding. The substrate or the surface layer of the substrate, however, can also be composed of a monocrystalline diamond or a column-crystalline diamond. If the substrate or the substrate surface layer is composed of diamond, it is advantageous if this diamond has high heat conductivity, which means that it has high purity.

The low pressure diamond layer grown on the substrate does not necessarily need to be single crystalline, whereas, according to the invention, it has to be enriched in any case in the carbon isotope $C^{12}$. This $C^{12}$-enriched low pressure diamond layer, according to the invention, can be, for example, monocrystalline or column-crystalline, as mentioned, however, it is preferably single crystalline.

For good utilisability for heat conduction, it is advantageous that the low pressure diamond layer grown at least partially covers the substrate and is larger than the heat source whose heat is to be conducted away, and that the low pressure diamond layer has a minimum thickness of 4 μm. The thicker the low pressure diamond layer, the better the heat conduction, but for cost reasons there are upper limits with respect to the layer thickness.

The phonon heat conduction of diamonds can lead to difficulties in heat transfer at the interfaces between diamond and non-diamond. This can occur, for example, if a transfer of heat is to take place from the diamond to a metal, since in the metals almost only the easily mobile electrons are responsible for heat conduction.

In order to solve this problem, it is preferred according to the invention if the composite element has, on its surface and/or under its low pressure diamond layer, an additional layer of an inorganic substance which favours a transfer of phonon pulses from and to the diamond lattice. An additional layer of this type acts as a heat transfer mediator for other substances, such as metals. Advantageously, an additional layer of this type is composed of another superhard substance or of a hard substance from the group comprising the carbides, nitrides, borides, phosphides, sulphides, aluminides and oxides or their mixed crystals or of intermetallic compounds and phases of metals and metalloids in which, in addition to the electrons, phonons also undertake a considerable proportion of the heat conduction. Stated more generally, inorganic materials can be used for the additional layer for improving the transfer of phonon pulses in which materials, owing to the nature of their atoms (size and weight) and owing to their spatial arrangement, such a transfer of the phonon pulses (energy) takes place particularly favourably. Such additional layers, which can grow completely or partly epitactically on diamond layers, can be applied, for example, by the customary PVD process, CVD process or by sputtering.

It is furthermore preferred if the composite element has a surface layer which protects the low pressure diamond layer grown against destruction or change. Such a surface layer can simultaneously have the property of favouring the transfer of phonon pulses from and to the diamond lattice, but does not have to have this property. This layer can also be applied by the PVD process, CVD process or by sputtering. It can protect the diamond from possible chemical reactions, such as chemical surface attack, diffusion and catalytic acceleration of the conversion of diamond into graphite, such as, for example, against destruction of the unprotected diamond by oxidation, which already commences at relatively low temperatures below 500° C.

For example, such a layer can be a thin layer of titanium carbide or titanium nitride or silicon carbide.

The substrate, for example, can also be a tool having a surface layer which permits the growth of the low pressure diamond layer.

Possible low pressure synthesis processes for the growth of the diamond layer on the substrate are basically all processes which permit growth of a diamond layer from the gas phase with enrichment of the carbon isotope $C^{12}$ according to the low pressure diamond synthesis. In particular, suitable processes are those which can produce epitaxially grown diamond crystals on the substrate which are as low as possible in defects. Microwave processes, hot filament processes, plasma processes and chemical flame processes, pulsed and continuous direct and alternating current charges, which can be conducted in the area near the electric arc, and diverse combination processes thereof are suitable. These processes are known per se from the literature, in particular for the preparation of single crystalline semiconductors.

The pressures to be used are advantageously in the range from 0.1 to 760 torr, preferably in the range from 10 to 200 torr, in the microwave process, RF plasma process and RF flame process and the DC/AC glow discharge process and hot filament process, at least 10 torr and preferably 300 to 760 torr in the hot arc plasma process and at least 10 torr, preferably 500 to 760 torr, in the chemical flame process.

In all these processes, the gas flow quantities are expediently 1 to 300 liters per hour, preferably 10 to 100 liters per hour, relative to normal pressure and typically for small laboratory reactors having a diameter of 3 to 10 cm. The flow rates are typically a few meters per second, but are strongly dependent on the gas pressure and temperature and the reactor size. Cooling of the substrate can be advantageous in all processes mentioned. The substrate temperature is favourably 350° to 1200° C., preferably 600° to 1050° C. The gas mixture is advantageously composed of hydrogen containing a source of carbon, such as methane or other hydrocarbons. The proportion of carbon in the gas mixture is advantageously 0.01 to 20% by volume, preferably 0.5 to 2% by volume. The proportion of oxygen, relative to the total gas mixture, is favourably 0.01 to 10% by volume, preferably 0.1 to 1% by volume. Instead of the addition of oxygen, the gas mixture can also contain an organic oxygen-containing compound, such as an alcohol, acetone or the like, which can simultaneously be the source of carbon. The hydrogen can also be replaced by fluorine. In the chemical flame process, a mixture of hydrocarbon with pure oxygen is favourably used, acetylene or methane, for example, being used as the hydrocarbon. With respect to carrying out the process, the literature reference "Proceedings 12. Int. Plansee-Seminar" of May 8th to 12th 1989, pages 615 to 631 is referred to.

In general, relatively slow growth rates, produced by low carbon concentrations kept within certain limits, low gas pressure etc., combined with low oxygen contents, particularly lead to the desired result.

The composite elements according to the invention can be used to great advantage for different purposes, in particular for heat conduction.

Composite elements according to the invention can be used to advantage for passive heat conduction. By virtue of the high heat conductivity, improvements can be achieved with respect to heat conduction or temperature reduction of an energy source which is directly applied to the surface of the diamond layer of the composite element according to the invention. It is advantageous here if the body producing heat or cold, i.e. the energy source, is smaller than the diamond layer. Heat or cold, which is transferred to the diamond surface by means of radiation or by convection of gases, liquids or solids or is generated directly when accelerated particles, molecules, radicals, atoms, ions, electrons etc. impinge on the surface of the diamond layer, can be dissipated in an analogous manner, as a result of which the temperature occurring at the diamond surface remains lower with the same amount of energy supplied than that the body would have without this layer.

From this, a number of applications of composite elements according to the invention result as surfaces which have to be heated or cooled in operation, for example as so-called heat sinks, such as are used industrially for semiconductors, or for heat conduction from bodies, such as focusing infrared lenses or surfaces of mechanical, electrical or electronic components.

If the heat source from which the heat is to be dissipated with the aid of the composite element according to the invention is smaller than the low pressure diamond layer on which the heat source rests, not only a flow of heat transversely through the diamond layer results, but additionally a flow of heat in the plane of the layer, so that the heat is rapidly distributed in the entire composite element and additionally improved heat conduction results.

The composite elements according to the invention can also be employed for applications having an additional active function of the surface of the composite element, other properties of the diamond being utilised in addition to the improved heat conductivity.

For example, by direct rubbing of the diamond layer with a body at high speed and high local pressure, heat can be generated on its surface. The great hardness of the diamond, its high chemical resistance and other advantageous properties would be impaired by strong heating, and its tendency to form graphite would greatly increase. Such circumstances can occur, for example, during metal-cutting in tools or in other processing and finishing operations subject to wear. Due to the good heat conduction of the composite elements according to the invention, the impairment of the other properties of the diamond is avoided. The reduction in the surface temperature of the diamond delays chemical and physical reactions, such as conversion to graphite, oxidation and carbon diffusion, and thus leads to lower losses and damage due to wear, corrosion, surface roughness, breaking up etc. The life of tools or components containing diamond layers is thus increased if these diamond layers are enriched in the carbon isotope $C^{12}$ according to the invention.

If the generation of heat takes place in point-like, tiny microregions, as is the case, for example, in many wear processes, the capacity for heat conduction, which is restricted to small surface areas, can also produce the desired effect. The subject of the invention can therefore also display its activity if a polycrystalline layer structure is produced by many continuous columnar crystals. Layer structures of this type are frequently formed spontaneously in the CVD process. Each individual grain of a layer of this type then acts individually in the direction of the columnar crystal axis as a heat-conducting element like a single crystal. It is advantageous here if the lattice defects preferably occur in the grain boundaries and the columnar crystal grains themselves are as defect-free and single crystalline as possible.

A monocrystal which, as is known, is less perfect than a single crystal, also acts in a similar manner with small angle grain boundaries and uniform crystal orientation, which are formed with favourable growth circumstances of the diamond. With such monocrystals, a similar effect to that with a single crystal can frequently be achieved.

As has been mentioned in depth above, additional advantages can be achieved in all these applications if the surface of the low pressure diamond layer with $C^{12}$ enrichment is additionally provided with a further coating which favours a transfer of phonon pulses from and to the diamond lattice and/or functions as a protective layer against the introduction of chemical and physical reactions.

EXAMPLE 1

A low pressure diamond layer was deposited on a substrate composed of a high pressure diamond single crystal (for example a Sumi crystal) at a substrate surface temperature of 1050° C. using $C^{12}$-enriched carbon in an Astex microwave apparatus (1.5 kW). The power of the apparatus was 1.2 kW, the gas pressure 80 torr and the deposition time 20 hours. The composition of the gas used in the apparatus was hydrogen containing 0.5% methane and 0.02% water vapour. During the said deposition time a diamond layer having a thickness of 15 μm was formed.

EXAMPLE 2

A low pressure diamond layer was deposited by the hot filament process on a high pressure diamond single crystal for heat sinks (Sumi crystal) at a substrate surface temperature of 950° to 1050° C. during a deposition time of 48 hours. The apparatus contained a tantalum wire at 2100° or 2200° C. The distance to the substrate was 7/11 mm (wire diameter 0.3 mm/1000 watt) or 25/40 mm (wire diameter 2 mm/7 kW). $C^{12}$-enriched carbon was used. The gas mixture used was composed of hydrogen containing 0.8 mol % of acetone or 0.4 mol % of methanol. The deposition time was 48 hours, a diamond layer having a thickness of 30/45 μm being formed.

EXAMPLE 3

Example 2 was repeated, a 2 μm thick layer of TiC or Ti(N, C) or SiC additionally being applied in the CVD process or a 0.5 μm thick layer of these hard substances being applied in the PVD process to the surface of the low pressure diamond layer formed.

EXAMPLE 4

A cutting tool was improved according to the invention by a diamond intermediate layer, the entire cutting tool being regarded as a composite element according to the invention.

The substrate was composed of an indexable insert based on tungsten carbide/cobalt or tungsten carbide/tantalum carbide/titanium carbide/cobalt.

A thin layer of titanium carbide with a thickness of 4 μm was applied by the customary CVD process to this indexable insert as a sealing layer against cobalt diffusion and to improve the heat transfer.

A low pressure diamond layer of a thickness of 10 μm was applied over this in the microwave process using the measures of Example 1. Over this again followed a 4 μm thick titanium carbide layer applied by the CVD process for increasing the heat transfer and as protection against oxidation and as the last layer an 8 μm thick $Al_2O_3$ layer (CVD process) for improving the resistance to wear.

I claim:

1. Composite element having improved heat conductivity, comprising a substrate having a surface layer that enables growth of column-crystalline diamond from the gas phase, and a low pressure diamond layer grown on the substrate, wherein the grown diamond layer is enriched compared to the normal diamond composition in the carbon iostope $C^{12}$ and depleted in the heavier carbon isotopes $C^{13}$ and $C^{14}$ and is composed of column-crystalline diamond.

2. Composite element according to claim 1, characterized in that the grown diamond layer contains at most 0.5% by weight of the carbon isotopes $C^{13}$ and $C^{14}$.

3. Composite element according to any one of claims 1 or 2, characterized in that the substrate is single crystalline or comprises a single crystalline surface layer.

4. Composite element according to claim 3, characterized in that the single crystalline substrate or the single crystalline surface layer of the substrate is composed of a diamond single crystal which is not enriched in the carbon isotope $C^{12}$.

5. Composite element according to claim 4, characterized in that the single crystalline substrate or the single crystalline surface layer of the substrate is composed of diamond having few impurities and high heat conductivity.

6. Composite element according to claim 3, characterized in that the single crystalline substrate or the single crystalline surface layer of the substrate is composed of BN, BP, $C_3N_4$ or a mixed crystal, a ternary phase or a mixed substance composed of one or more of the elements C, B, N, O, P and S.

7. Composite element according to any one of claims 1 or 2, characterized in that the substrate is composed of monocrystalline or column-crystalline diamond or has a monocrystalline or column-crystalline surface layer.

8. Composite element according to any one of claims 1 or 2, characterized in that the surface layer of the substrate is composed of a thin layer of diamond-like carbon, amorphous diamond or another carbon-containing substance.

9. Composite element according to one any one of claims 1 or 2, characterized in that the grown diamond layer covers the substrate at least partially and has a minimum thickness of 4 μm.

10. Composite element according to any one of claims 1 or 2, wherein the composite element further comprises a layer of an inorganic substance disposed against at least one surface of the grown diamond leayer which favours a transfer of phonon pulses from and to the grown diamond layer.

11. Composite element according to claim 10, characterized in that the inorganic layer is composed of a superhard substance or a hard substance selected from the group consisting of carbides, nitrides, borides, phosphides, sulphides, aluminides and oxides or their mixed crystals or a hard intermetallic phase.

12. Composite element according to any one of claims 1 or 2, wherein the composite element further comprises an additional protective outer layer composed of titanium carbide, titanium nitride, titanium carbonitride, titanium boride or silicon carbide.

13. Use of a composite element according to any one of claims 1 or 2 for heat conduction.

14. Process for the preparation of a composite element by growing a diamond column-crystalline layer by low pressure diamond synthesis on a substrate, characterized in that, during the growth of the diamond layer a gas enriched in the carbon isotope $C^{12}$ and depleted in the heavier carbon isotopes $C^{13}$ and $C^{14}$ is used in the gas phase.

15. Process according to claim 14, characterized in that the substrate is single crystalline or comprises a single crystalline surface layer.

16. Process according to claim 14, characterized in that the substrate does not enable heteroepitactic growth of a single crystalline diamond layer, and the surface layer of the substrate under the conditions of the low pressure diamond synthesis assumes a crystal orientation enabling growth of the column-crystalline diamond layer.

17. Process according to claim 14, characterized in that a layer on an inorganic substance which favours a transfer of phonon pulses from and to the grown diamond layer is applied to at least one surface of the grown diamond layer by the PVD process, CVD process or by sputtering.

18. Process according to claim 17, characterized in that the inorganic layer is a superhard substance or a hard substance selected from the group consisting of carbides, nitrides, borides, phosphides, sulphides, aluminides and oxides or their mixed crystals or a hard intermetallic phase.

* * * * *